(12) United States Patent
Nagao et al.

(10) Patent No.: US 10,191,123 B2
(45) Date of Patent: Jan. 29, 2019

(54) MAGNETIC FIELD MEASUREMENT DEVICE

(71) Applicant: AICHI STEEL CORPORATION, Tokai-shi (JP)

(72) Inventors: Tomohiko Nagao, Aichi (JP); Michiharu Yamamoto, Aichi (JP)

(73) Assignee: AICHI STEEL CORPORATION, Tokai-shi (JP)

( * ) Notice: Subject to any disclaimer, the term of this patent is extended or adjusted under 35 U.S.C. 154(b) by 19 days.

(21) Appl. No.: 15/502,370

(22) PCT Filed: Jul. 31, 2015

(86) PCT No.: PCT/JP2015/071757
§ 371 (c)(1),
(2) Date: Feb. 7, 2017

(87) PCT Pub. No.: WO2016/039036
PCT Pub. Date: Mar. 17, 2016

(65) Prior Publication Data
US 2017/0234938 A1 Aug. 17, 2017

(30) Foreign Application Priority Data
Sep. 10, 2014 (JP) .................................. 2014-184392

(51) Int. Cl.
*G01R 33/00* (2006.01)
*G01R 33/02* (2006.01)
*G01R 33/06* (2006.01)

(52) U.S. Cl.
CPC ......... *G01R 33/0017* (2013.01); *G01R 33/02* (2013.01); *G01R 33/063* (2013.01)

(58) Field of Classification Search
CPC ............ G01R 33/0017; G01R 33/0029; G01R 33/0035; G01R 33/02; G01R 33/025; G01R 33/063
(Continued)

(56) References Cited

U.S. PATENT DOCUMENTS

| 3,400,328 A | * | 9/1968 | Penn | ...................... | G01R 33/05 |
| | | | | | 324/247 |
| 4,303,886 A | * | 12/1981 | Rhodes | .................. | G01R 33/04 |
| | | | | | 324/255 |

(Continued)

FOREIGN PATENT DOCUMENTS

| JP | 2000-193728 A | 7/2000 |
| JP | 2002-181908 A | 6/2002 |

(Continued)

OTHER PUBLICATIONS

International Search Report dated Oct. 6, 201 5 in PCT/JP2015/071757 filed Jul. 31, 2015.

(Continued)

*Primary Examiner* — Jeff Natalini
*Assistant Examiner* — Steven Yeninas
(74) *Attorney, Agent, or Firm* — Oblon, McClelland, Maier & Neustadt, L.L.P.

(57) ABSTRACT

A magnetic field measurement device capable of accurate measurement of a magnetic field even after a sensitivity of an MI sensor varies is provided. A magnetic field measurement device (1) includes an MI sensor (2) and a sensitivity calculation means (3). The MI sensor (2) includes a magneto-sensitive body (20), a detection coil (21) and a magnetic field generation coil (22) that generates a magnetic field upon energization. The sensitivity calculation means (3) varies a current flowing in the magnetic field generation coil (22) in a state where an outside-sensor magnetic field (Continued)

$H_O$ acting on the magneto-sensitive body (20) from outside the MI sensor (2) is constant. Consequently, the magnetic field acting on the magneto-sensitive body (20) is varied to calculate a sensitivity a by dividing a variation in an output voltage of the detection coil (21) by a variation in the magnetic field acting on the magneto-sensitive body (20).

8 Claims, 12 Drawing Sheets

(58) Field of Classification Search
USPC ............... 324/202, 225, 253, 254, 258, 260; 702/85, 87, 88
See application file for complete search history.

(56) References Cited

U.S. PATENT DOCUMENTS

| | | | |
|---|---|---|---|
| 2004/0207398 A1* | 10/2004 | Kudo | G01R 33/02 324/249 |
| 2005/0023501 A1* | 2/2005 | Ishida | C04B 35/265 252/62.59 |
| 2006/0038561 A1 | 2/2006 | Honkura et al. | |
| 2009/0108841 A1 | 4/2009 | Abe et al. | |
| 2012/0212216 A1* | 8/2012 | Stahl-Offergeld | G01R 33/0017 324/251 |
| 2013/0307547 A1* | 11/2013 | Honkura | G01C 17/38 324/345 |
| 2015/0077101 A1* | 3/2015 | Oikawa | G01R 33/0041 324/258 |

FOREIGN PATENT DOCUMENTS

| | | |
|---|---|---|
| JP | 2002-243815 A | 8/2002 |
| JP | 3572457 B2 | 10/2004 |
| JP | 3801194 B2 | 7/2006 |
| JP | 2008-241675 A | 10/2008 |
| JP | 2009-133672 A | 6/2009 |
| JP | 4632142 B2 | 2/2011 |
| WO | WO 2005/019851 A1 | 3/2005 |
| WO | WO 2007/132592 A1 | 11/2007 |

OTHER PUBLICATIONS

Extended European Search Report dated Aug. 17, 2017 in Patent Application No. 15839774.5.

* cited by examiner

MAGNETIC FIELD MEASUREMENT DEVICE

TECHNICAL FIELD

The present invention relates to a magnetic field measurement device including a magneto-impedance sensor.

BACKGROUND ART

As a magnetic field measurement device that measures a magnetic field, one using a magneto-impedance sensor (hereinafter also referred to as "MI sensor") is known (see Patent Document 1 as below). The MI sensor includes a magneto-sensitive body formed of an amorphous alloy, and a detection coil wound around the magneto-sensitive body. The MI sensor is configured to output a voltage corresponding to a magnetic field acting on the magneto-sensitive body from the detection coil.

If the magnetic field acting on the magneto-sensitive body is relatively weak, the output voltage of the detection coil is substantially proportional to the magnetic field. In other words, in this case, the output voltage is expressed as a linear function of the magnetic field. The magnetic field measurement device stores the slope of the linear function as a sensitivity. The magnetic field measurement device is configured to calculate the magnetic field acting on the magneto-sensitive body, using the sensitivity and the output voltage of the detection coil.

PRIOR ART DOCUMENT

Patent Document

Patent Document 1: WO2005/19851

SUMMARY OF THE INVENTION

Problem to be Solved by the Invention

However, the aforementioned magnetic field measurement device has a problem in that magnetic field measurement accuracy is not sufficiently high. In fact, the magnetic field measurement device is configured to store the sensitivity of the MI sensor measured in, e.g., a manufacturing plant, and calculate a magnetic field using the value of the sensitivity stored in the magnetic field measurement device when used by a user. The magnetic field measurement device is designed under the assumption that the sensitivity would not change after production. Thus, the structure of the magnetic field measurement device is unable to remeasure the sensitivity. However, in reality, the sensitivity of the MI sensor may change with temperature change or due to aging. Thus, there is a problem in that for accurate calculation of the magnetic field, sensitivity change has to be measured and an updated sensitivity has to be used.

The present invention has been made in view of such circumstances, and is intended to provide a magnetic field measurement device that is capable of accurate measurement of a magnetic field even after a sensitivity of an MI sensor has changed.

Means for Solving the Problem

An aspect of the present invention is a magnetic field measurement device for measuring a magnetic field, including:

a magneto-impedance sensor including a magneto-sensitive body, a detection coil that is wound around the magneto-sensitive body and outputs a voltage corresponding to a magnetic field acting on the magneto-sensitive body, and a magnetic field generation coil that is wound around the magneto-sensitive body and generates a magnetic field upon energization; and a sensitivity calculation means for calculating a sensitivity, the sensitivity being a value that is obtained by varying a value of a current flowing in the magnetic field generation coil to vary the magnetic field acting on the magneto-sensitive body in a state where an outside-sensor magnetic field that acts on the magneto-sensitive body from outside the magneto-impedance sensor is constant, and dividing a variation in an output voltage of the detection coil by a variation in the magnetic field acting on the magneto-sensitive body.

Effects of the Invention

The abovementioned magnetic field measurement device includes the magnetic field generation coil formed on the magneto-sensitive body of the MI sensor. And the magnetic field measurement device includes the sensitivity calculation means for calculating the sensitivity using this magnetic field generation coil.

Thus, when the user uses the magnetic field measurement device, the sensitivity of the MI sensor can be calculated periodically. Therefore, even after the sensitivity changes, the magnetic field can be calculated using an updated sensitivity. Thus, accurate magnetic field measurement can be performed.

As stated above, the present invention enables to provide a magnetic field measurement device that is capable of accurate measurement of a magnetic field even after a sensitivity of an MI sensor changes.

BRIEF DESCRIPTION OF THE DRAWINGS

FIG. 4 is the graph in FIG. 3 reflecting change due to aging or the like.

MODE FOR CARRYING OUT THE INVENTION

It is preferable that the abovementioned magnetic field measurement device further include a magnetic field calculation means, and in the magnetic field measurement device, the magneto-impedance sensor be mounted on a mobile device, the outside-sensor magnetic field be a composition magnetic field of an outside-device magnetic field that acts on the magneto-sensitive body from outside the mobile device and an inside-device magnetic field that is generated from an electronic component provided inside the mobile device and acts on the magneto-sensitive body, and the magnetic field calculation means calculate a value of the outside-device magnetic field using the sensitivity calculated by the sensitivity calculation means and the output voltage of the detection coil.

The inside-device magnetic field is often more intense than the outside-device magnetic field as a target for measurement. Thus, when the MI sensor is mounted on the mobile device, an intense inside-device magnetic field often acts on the magneto-sensitive body. The sensitivity of the MI sensor is constant within a specific magnetic field range, and the sensitivity changes when an intense magnetic field beyond this range acts on the magneto-sensitive body (see FIG. 2). Thus, the MI sensor has been used inevitably for a limited range in which the sensitivity can be deemed as constant. However, since the magnetic field measurement device according to the present invention includes the sensitivity calculation means, even if an intense inside-device magnetic field acts on the magneto-sensitive body and the sensitivity falls outside the range in which the sensitivity can be deemed as constant, the magnetic field measurement device can calculate the sensitivity at that point of time, and accurately measure the outside-device magnetic field using the sensitivity. Therefore, even if an intense magnetic field acts on the magneto-sensitive body, the MI sensor can be used. In other words, a magnetic field intensity range available for the MI sensor can be widened.

Also, it is preferable that the sensitivity calculation means vary the value of the current flowing in the magnetic field generation coil so that the inside-device magnetic field is cancelled out by a coil magnetic field generated from the magnetic field generation coil, and calculate the sensitivity in a process to vary the value of the current, and the magnetic field calculation means calculate the value of the outside-device magnetic field in a state where a magnitude of the magnetic field acting on the magneto-sensitive body is made to be smaller than a predetermined threshold value by feeding a current to the magnetic field generation coil.

Figure 2:
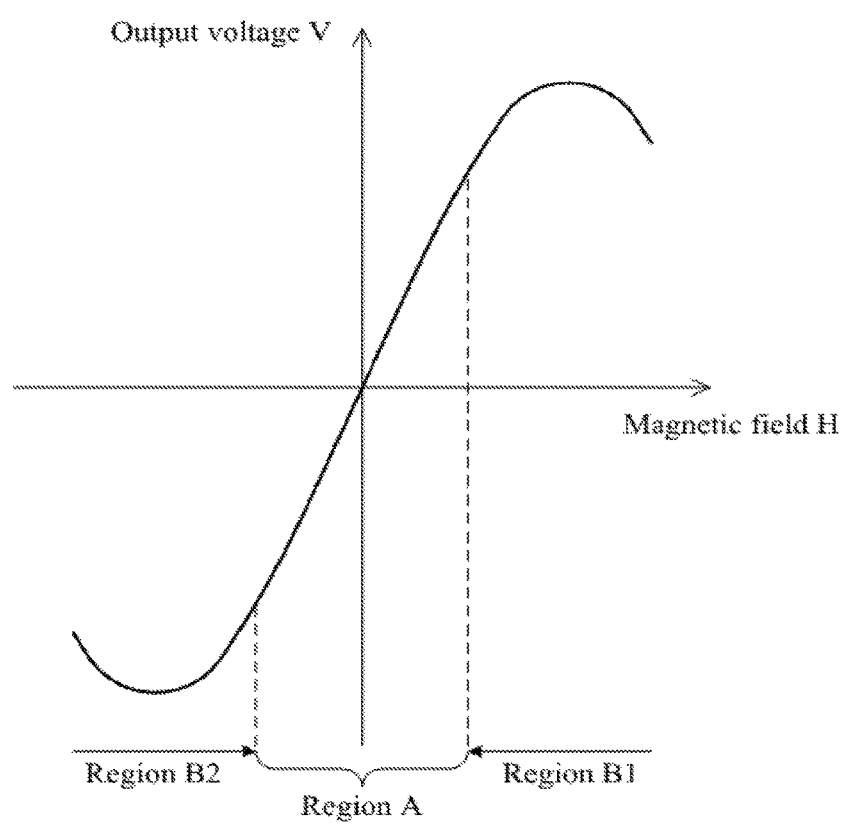
FIG. 2 is a graph indicating a relationship between a magnetic field acting on a magneto-sensitive body and an output voltage of a detection coil in Embodiment 1.
Figure 3:
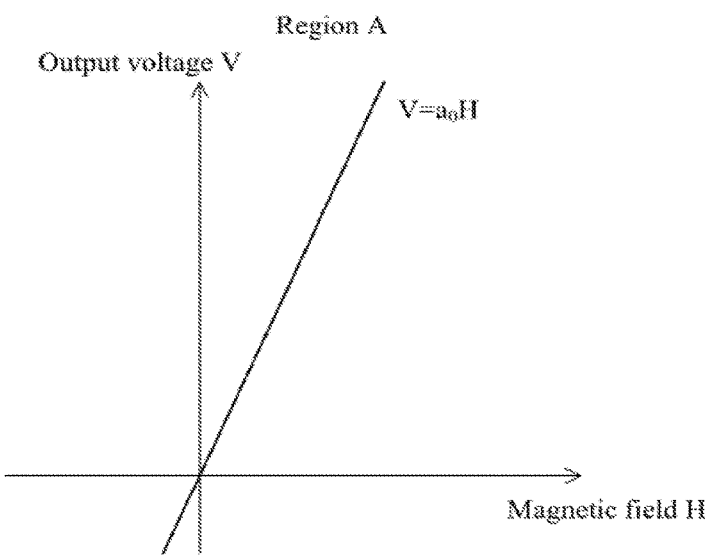
FIG. 3 is a graph that is an enlargement of a part around an origin of the graph in FIG. 2.

As described above, the magnetic field intensity range in which the sensitivity of the MI sensor is constant is limited (see region A in FIG. 2). In the magnetic field measurement device, the value of the outside-device magnetic field is calculated in a state in which the magnetic field acting on the magneto-sensitive body is made to be smaller than the threshold value by flowing a current in the magnetic field generation coil. Thus, even if the intensity of the magnetic field acting on the magneto-sensitive body falls beyond the range in which the sensitivity is constant, the outside-device magnetic field can be measured after reducing the intensity of the magnetic field by means of the magnetic field generation coil to make the intensity of the magnetic field fall within the range in which the sensitivity is constant. Therefore, the outside-device magnetic field can be more accurately calculated.

Embodiments (Embodiment 1)

An embodiment of the above magnetic field measurement device will be described with reference to FIGS. 1 to 11. As illustrated in FIG. 8, a magnetic field measurement device 1 according to the present embodiment includes a MI sensor 2 and a sensitivity calculation means 3.

Figure 1:
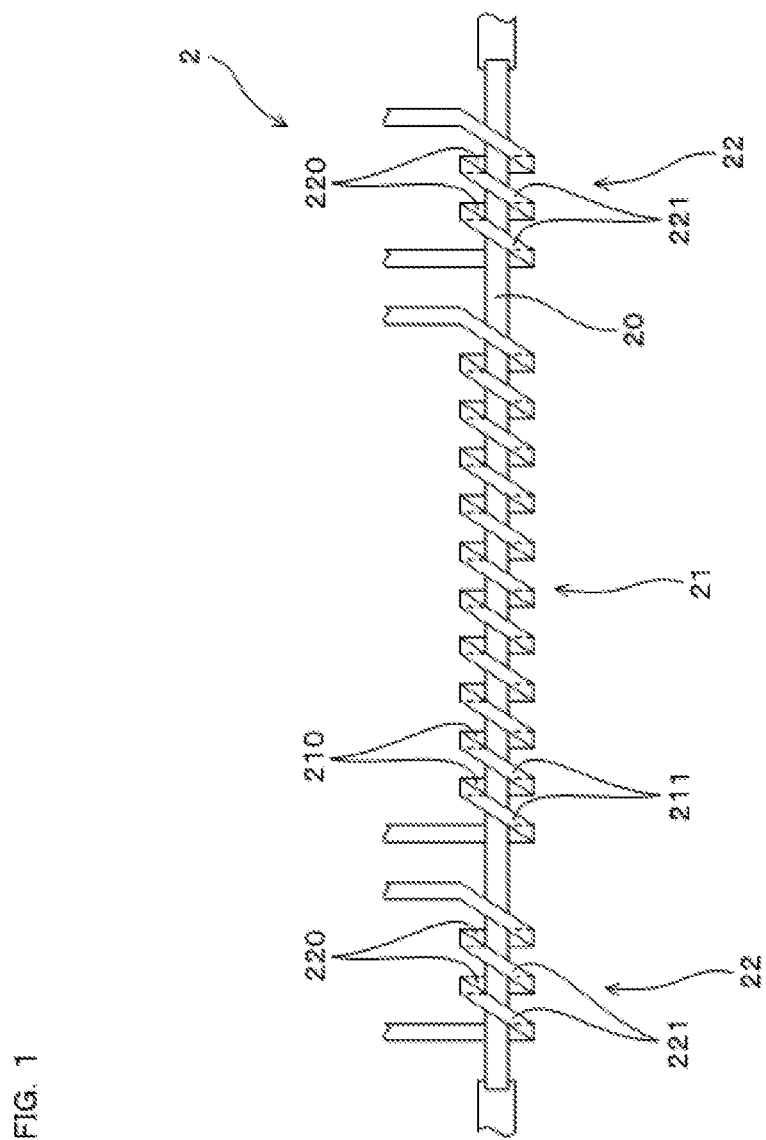
FIG. 1 is a plan view of an MI sensor in Embodiment 1.

As illustrated in FIG. 1, the MI sensor 2 includes a magneto-sensitive body 20, a detection coil 21 and magnetic field generation coils 22. The detection coil 21 is wound around the magneto-sensitive body 20, and outputs a voltage corresponding to a magnetic field acting on the magneto-sensitive body 20. Each of the magnetic field generation coils 22 is wound around the magneto-sensitive body 20 and generates a magnetic field upon energization.

Figure 6:
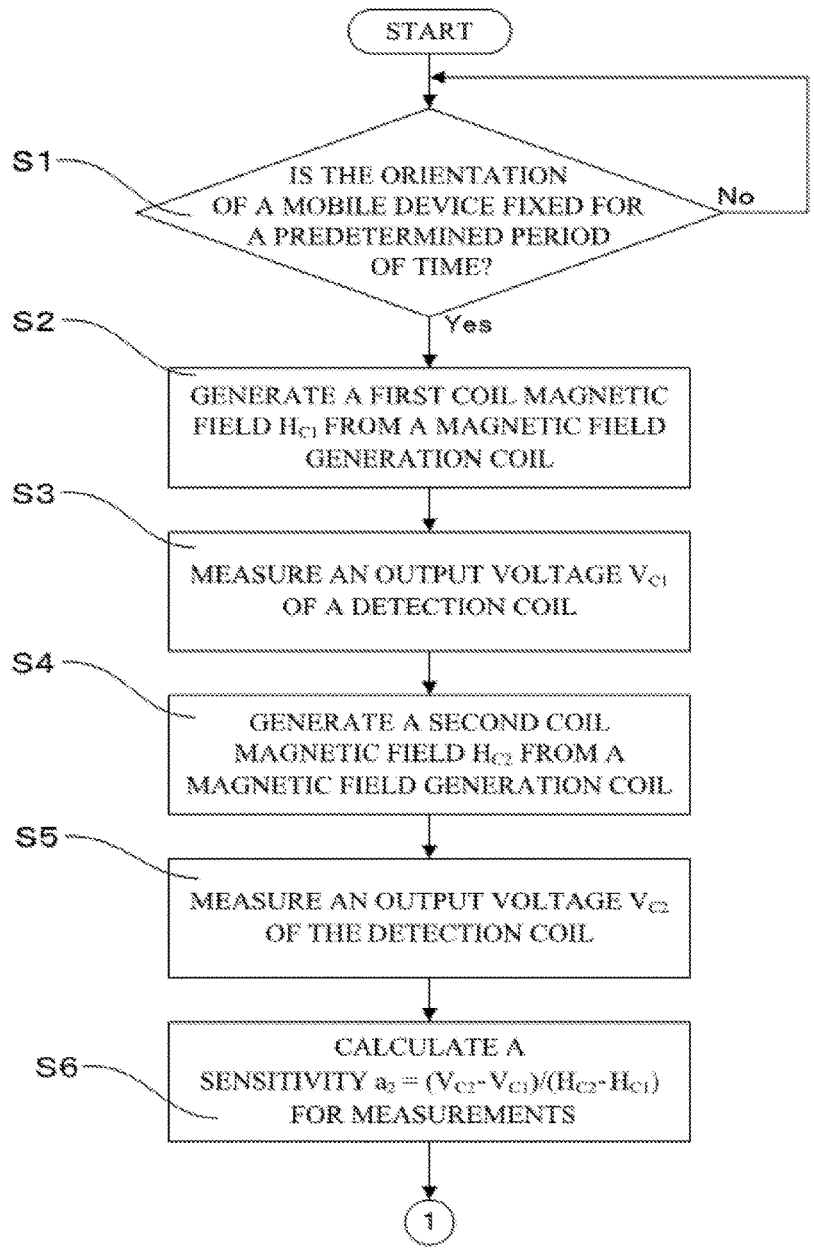
FIG. 6 is a flowchart for a magnetic field measurement device in Embodiment 1.

As indicated in the flowchart (details will be described later) in FIG. 6, the sensitivity calculation means 3 varies a current flowing in the magnetic field generation coils 22 in a state where an outside-sensor magnetic field $H_O$ that acts on the magneto-sensitive body 20 from outside the MI sensor 2 is constant. Consequently, the magnetic field acting on the magneto-sensitive body 20 is varied, and as indicated in step S6, the sensitivity calculation means 3 calculates a sensitivity a that is a value obtained by dividing a variation $V_{C2}-V_{C1}$ of the output voltage of the detection coil 21 by a variation $H_{C2}-H_{C1}$ of the magnetic field acting on the magneto-sensitive body 20.

Figure 9:
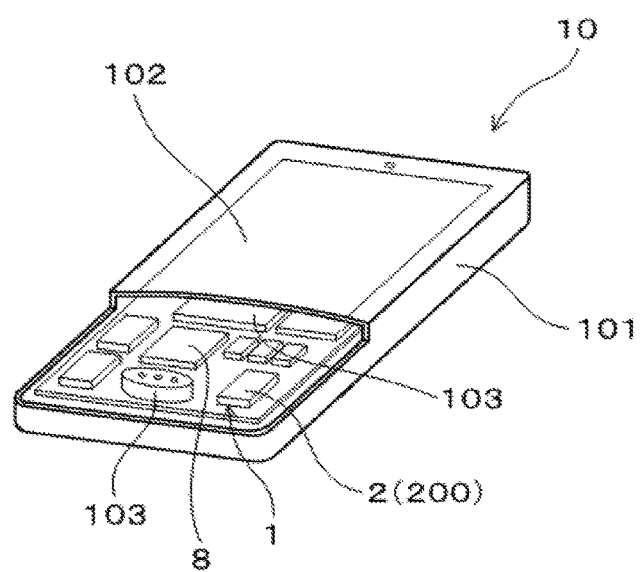
FIG. 9 is an exploded perspective view of a mobile device in Embodiment 1.

As illustrated in FIG. 9, the MI sensor 2 is mounted on the mobile device 10. The outside-sensor magnetic field $H_O$ is a composition magnetic field of an outside-device magnetic field $H_E$ that acts on the magneto-sensitive body 20 from outside the mobile device 10 and an inside-device magnetic field $H_I$ that is generated from an electronic component 103 provided inside the mobile device 10 and acts on the magneto-sensitive body 20. The magnetic field measurement device 1 according to the present embodiment includes a magnetic field calculation means 5 for calculating a value of the outside-device magnetic field $H_E$ using the sensitivity a calculated by the sensitivity calculation means 3, and the output voltage of the detection coil 21. Also, in the present embodiment, a geomagnetic field is calculated as the outside-device magnetic field $H_E$.

As illustrated in FIG. 9, the mobile device 10 is provided with a microcomputer 8. As illustrated in FIG. 8, the microcomputer 8 includes a CPU 81, a ROM 82, a RAM 83, an I/O 84 and a wiring 85 connecting these components. The ROM 82 stores a program 82p. Upon the CPU 81 reading and executing the program 82p, the sensitivity calculation means 3 and the magnetic field calculation means 5 in the present embodiment are performed.

Next, a structure of the MI sensor 2 will be described with reference to FIG. 1. The MI sensor 2 includes a substrate (not illustrated). The magneto-sensitive body 20 is fixed to the substrate. The magneto-sensitive body 20 is formed of a material that exerts an MI effect, for example, a Co—Fe—Si—B-based amorphous alloy with no magnetostriction. A surface of the magneto-sensitive body 20 is covered with an insulating resin or the like. The detection coil 21 is formed of a metal such as Cu. The detection coil 21 includes, for example, lower pattern portions 210 each positioned between the magneto-sensitive body 20 and the substrate and upper pattern portions 211 connected to the respective lower pattern portions 210, the upper pattern portions 211 extending over the magneto-sensitive body 20.

Also, the magnetic field generation coils 22 are formed at two locations so as to interpose the detection coil 21 therebetween. Each magnetic field generation coils 22 has a structure similar to that of the detection coil 21, and includes lower pattern portions 220 and upper pattern portions 221.

In the present embodiment, at the time of manufacture of the MI sensor 2, a photolithography process and an etching process are performed on a metal thin film to form the lower pattern portions 210 of the detection coil 21 and the lower pattern portions 220 of each magnetic field generation coil 22 simultaneously. Likewise, in the present embodiment, a photolithography process and an etching process are performed to form the upper pattern portion 211 of the detection coil 21 and the upper pattern portions 221 of each magnetic field generation coil 22 simultaneously. As described above, in the present embodiment, the magnetic field generation coils 22 are formed simultaneously with forming the detection coil 21 that is essential for the MI sensor 2 through the same processes. Consequently, the magnetic field generation coils 22 can be formed without any additional dedicated process for forming the magnetic field generation coils 22.

Also in the present embodiment, a triaxial MI sensor 200 is formed by combination of three MI sensors 2. An orientation of the mobile device 10 is measured using values of an outside-device magnetic field $H_E$ (geomagnetic field), the values being measured by the three MI sensors 2, and is displayed on a display screen 102 (see FIG. 9). In other words, in the present embodiment, the magnetic field measurement device 1 is used as an electronic compass.

Here, assuming that there is no outside-device magnetic field $H_E$, what acts on each MI sensor 2 is only an inside-device magnetic field $H_I$. In this case, the detection coil 21 outputs an output voltage when only the inside-device magnetic field $H_I$ acts on the MI sensor, that is, an offset voltage $V_{OFF}$. The offset voltage $V_{VOFF}$ can be measured by what is called a calibration operation, i.e., orienting the mobile device 10 in various directions.

Next, output characteristics of the MI sensor 2 will be described. As illustrated in FIG. 2, in a region in which a magnetic field H acting on the magneto-sensitive body 20 is relatively small (region A), an output voltage V of the detection coil 21 is substantially proportional to the magnetic field H. In other words, in region A, a sensitivity a is substantially constant. However, the sensitivity a changes due to aging or heating (see FIGS. 3 and 4). Also, if a magnetic field that is more intense than that in region A acts on the MI sensor 2, the sensitivity a changes. The present embodiment is configured so that an outside-device magnetic field $H_E$ can be accurately measured even after the sensitivity a in region A changes. Also, the present embodiment is configured so that not only when a magnetic field in region A acts on the MI sensor 2, but also when a magnetic field that is more intense than that in region A, for example, a magnetic field in region B1 or B2, acts the MI sensor 2, an outside-device magnetic field $H_E$ can be accurately measured. First, a method for calculating a sensitivity a and an outside-device magnetic field $H_E$ in region A will be described.

Figure 4:
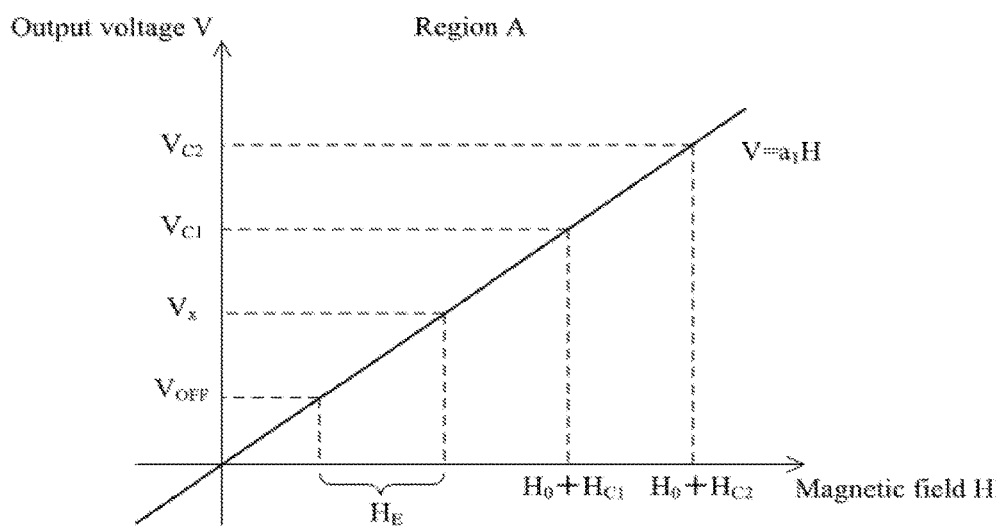

When calculating a latest sensitivity $a_1$ in region A, first, the orientation of the mobile device 10 is fixed to prevent variation in the outside-sensor magnetic field $H_O$. In this state, a current is made to flow in the magnetic field generation coils 22 to generate a first coil magnetic field $H_{C1}$. As illustrated in FIG. 4, in this state, a magnetic field $H_O+H_{C1}$ acts on the magneto-sensitive body 20. At this point, an output voltage $V_{C1}$ is measured. Next, the current flowing in the magnetic field generation coils 22 is varied to generate a second coil magnetic field $H_{C2}$. In this state, a magnetic field $H_O+H_{C2}$ acts on the magneto-sensitive body 20. At this point, an output voltage $V_{C2}$ is measured. Then, the sensitivity $a_1$ is calculated according to the following expression.

$$a_1 = (V_{C2} - V_{C1})/\{(H_O + H_{C2}) - (H_O + H_{C1})\}$$
$$= (V_{C2} - V_{C1})/(H_{C2} - H_{C1})$$

When measuring an outside-device magnetic field $H_E$, e.g., the aforementioned calibration operation is performed in advance to measure the offset voltage $V_{OFF}$. Then, in a state where an outside-device magnetic field $H_E$ exists, an output voltage $V_X$ of the detection coil 21 is measured. The output voltage $V_X$ is a value of the offset voltage $V_{OFF}$ with an effect of the outside-device magnetic field $H_E$ added. As illustrated in FIG. 4, the output voltage $V_X$, the offset voltage $V_{OFF}$ the sensitivity $a_1$ and the outside-device magnetic field $H_E$ satisfy the relationship expressed by the following expression. The outside-device magnetic field $H_E$ can be calculated according to this expression.

$$H_E = (V_X - V_{OFF})/a_1$$

Next, a case where a magnetic field acting on the magneto-sensitive body 20 falls outside region A will be described. If an intense inside-device magnetic field $H_I$ acts on the magneto-sensitive body 20 and the magnetic field falls outside region A, the output voltage V exhibits a curve as illustrated in FIG. 2. However, as in the present embodiment, when a geomagnetic field as the outside-device magnetic field $H_E$ is measured, a measurement range of the outside-device magnetic field $H_E$ is limited to a very narrow range (±40000 to 50000 T in the case of the geomagnetic field). Thus, in this limited range, no large error occurs in output voltage V even if the output voltage V is regarded as being a linear function of the magnetic field H.

A calculating process to calculate a sensitivity $a_2$ and an outside-device magnetic field $H_E$ when a magnetic field falls outside region A is similar to that to be performed when a magnetic field falls within region A. Processing for calculating a sensitivity $a_2$ in the case where a magnetic field falls outside region A will be described with reference to FIGS. 5 and 6. A first step to calculate the sensitivity $a_2$ is to determine whether or not the orientation of the mobile device 10 is fixed for a predetermined period of time (step S1). In other words, whether or not the outside-sensor magnetic field $H_O$ acting on the magneto-sensitive body 10 is constant for a predetermined period of time is determined. Here, if the determination results in "Yes", the processing proceeds to step S2 to generate a first coil magnetic field $H_{C1}$ from the magnetic field generation coils 22. Thus, a magnetic field acting on the magneto-sensitive body 20 is formed as $H_O+H_{C1}$ (see FIG. 5). Subsequently, the processing proceeds to step S3 to measure an output voltage $V_{C1}$ of the detection coil 22.

Next, the processing proceeds to step S4 to generate a second coil magnetic field $H_{C2}$ from the magnetic field generation coils 22. Thus, the magnetic field acting on the magneto-sensitive body 20 is formed as $H_O+H_{C2}$ (see FIG. 5). Subsequently, the processing proceeds to step S5 to measure an output voltage $V_{C2}$ of the detection coil 22. Here, it should be noted that in steps S2 to S5, an intensity of each coil magnetic fields $H_{C1}$ and $H_{C2}$ needs to be within a range of fluctuation of the outside-device magnetic field $H_E$ to be measured. Also, in the case where the outside-device magnetic field $H_E$ to be measured is a geomagnetic field, by changing the orientation of the mobile device 10, an intensity of the geomagnetic field to be detected by each of the three MI sensors 2 constituting the triaxial MI sensor 200 fluctuates around 0(T) as a center. Thus, 0(T) can be selected as an intensity of either of $H_{C1}$ and $H_{C2}$. Consequently, a usable sensitivity $a_2$ can be obtained within a range of fluctuation of the geomagnetic field that is a measurement target.

Subsequent to step S5, the processing proceeds to step S6 to calculate the sensitivity $a_2$ according to the following expression.

$$a_2 = (V_{C2} - V_{C1})/\{(H_O + H_{C2}) - (H_O + H_{C1})\}$$
$$= (V_{C2} - V_{C1})/(H_{C2} - H_{C1})$$

Figure 7:
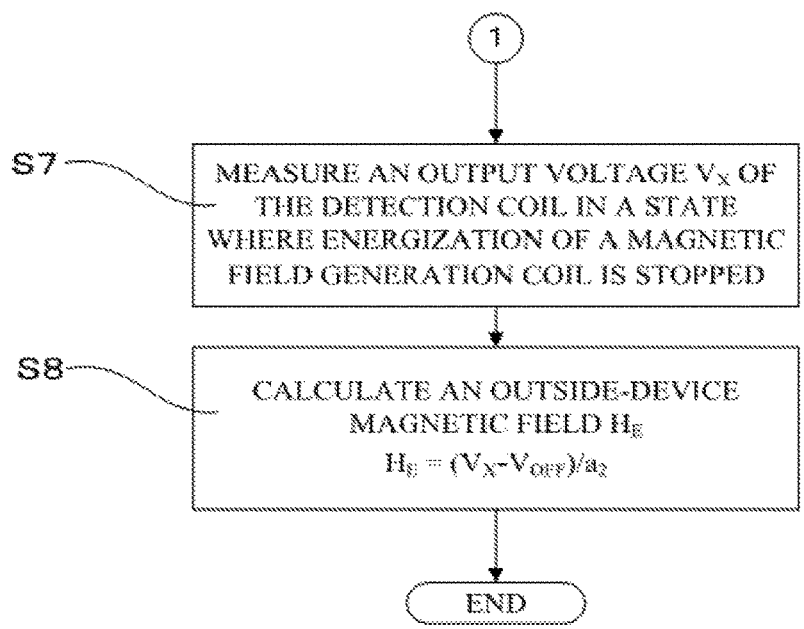
FIG. 7 is a flowchart following the flowchart in FIG. 6.
Figure 8:
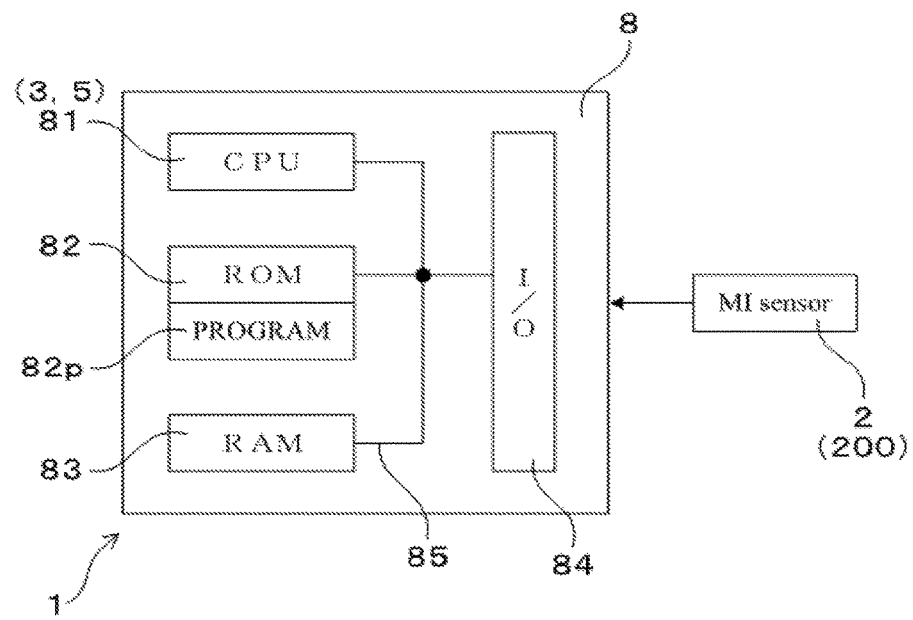
FIG. 8 is a conceptual diagram of the magnetic field measurement device in Embodiment 1.

When measuring the outside-device magnetic field $H_E$, as illustrated in FIG. 7, the output voltage $V_X$ of the detection coil 21 is measured in a state where energization of the magnetic field generation coils 22 is stopped (step S7). Subsequently, the outside-device magnetic field $H_E$ is calculated on the basis of the output voltage $V_X$, the offset voltage $V_{OFF}$ and the sensitivity $a_2$, according to the below expression (step S8).

$$H_E = (V_X - V_{OFF})/a_2$$

Operational effects of the present embodiment will be described. As illustrated in FIG. 1, in the present embodiment, the magnetic field generation coils 22 are formed on the magneto-sensitive body 20 of the MI sensor 2. Also, the sensitivity calculation means 3 for calculating a sensitivity a using the magnetic field generation coils 22 is provided.

Thus, when a user uses the magnetic field measurement device 1, the sensitivity a of the MI sensor 2 can be calculated periodically. Therefore, even after the sensitivity a changes because of variation in, e.g., an intensity of a magnetic field acting on the magneto-sensitive body 20 or a temperature of the magneto-sensitive body 20 due to change of environments for measurement, a target magnetic field to be measured, that is, an outside-device magnetic field $H_E$ can be calculated using the varied sensitivity a. Thus, the target magnetic field can be accurately measured.

Also, as illustrated in FIG. 9, the MI sensor according to the present embodiment is mounted on the mobile device 10.

The aforementioned inside-device magnetic field $H_I$ is often more intense than the target outside-device magnetic field $H_E$ to be measured. Thus, in the MI sensor 2 provided inside the mobile device 10, an intense inside-device magnetic field $H_I$ often acts on the magneto-sensitive body 20. In each MI sensor 2, if a magnetic field acting on the magneto-sensitive body 20 is within region A indicated in FIG. 2, the sensitivity a can be regarded as constant, however, if an intense magnetic field falling beyond region A acts on the magneto-sensitive body 20, the sensitivity a may change. However, since the magnetic field measurement device 1 according to the present embodiment includes the sensitivity calculation means 3, even if an intense inside-device magnetic field $H_I$ acts on the magneto-sensitive body 20 and the sensitivity a changes, the sensitivity a at that moment can be calculated. Thus, the outside-device magnetic field $H_E$ can be accurately measured using the varied sensitivity a.

As described above, conventionally, it is necessary that a MI sensor be used for region A only in which a sensitivity of the MI sensor is substantially constant, provision of the sensitivity calculation means 3 as in the present embodiment enables measurement of an outside-device magnetic field $H_E$ even if an intense magnetic field falling beyond region A acts on the magneto-sensitive body 20. Thus, an intensity range of the magnetic field available for the MI sensor 2 can be widened.

As described above, the present embodiment enables to provide a magnetic field measurement device that is capable of accurate measurement of the magnetic field even after a sensitivity of an MI sensor changes, and has a wide intensity range of the magnetic field available for the MI sensor.

Figure 10:
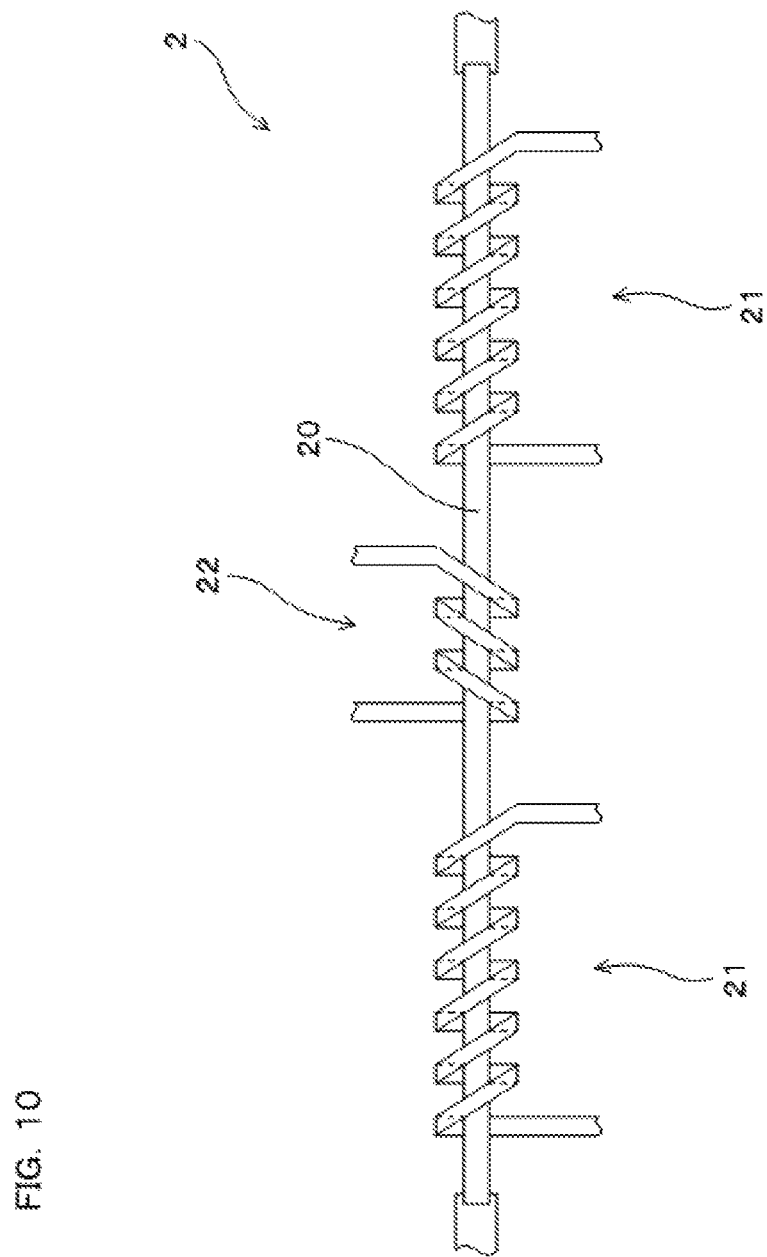
FIG. 10 is a plan view of an MI sensor in Embodiment 1, in which a magnetic field generation coil is provided between two detection coils.
Figure 11:
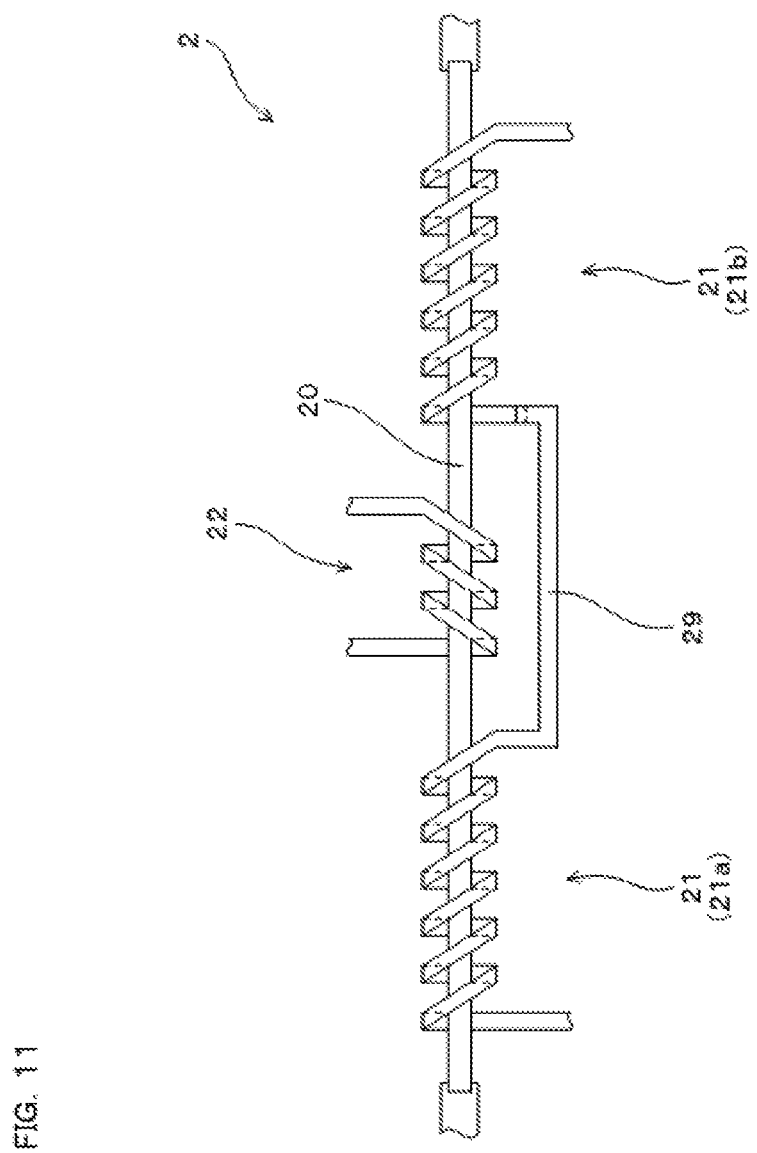
FIG. 11 is a plan view of an MI sensor in Embodiment 1, in which two detection coils are connected to each other.

In the present embodiment, as illustrated in FIG. 1, one detection coil 21 is provided between two magnetic field generation coils 22. The present invention, however, is not limited to this configuration. In other words, for example, as illustrated in FIG. 10, one magnetic field generation coil 22 may be provided between two detection coils 21. Also, as illustrated in FIG. 11, two detection coils 21 (21a and 21b) may be connected by a connection wire 29.

Figure 5:
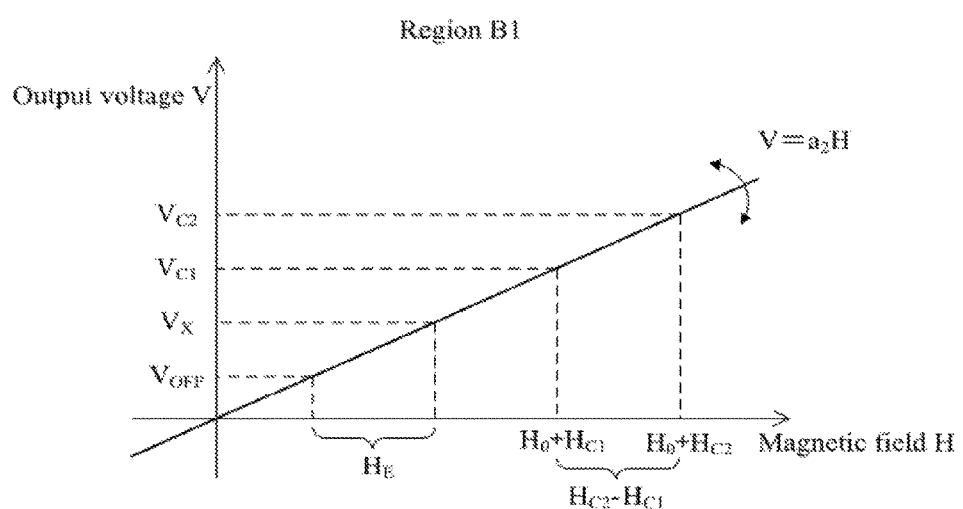
FIG. 5 is a graph that is an enlargement of a part of region B1 indicated in FIG. 2.

In the present embodiment, as illustrated in FIGS. 4 and 5, when calculating a sensitivity a, a first coil magnetic field $H_{C1}$ and a second coil magnetic field $H_{C2}$ are generated from the magnetic field generation coils 22 and resulting output voltages $V_{C1}$ and $V_{C2}$ are used. The present invention, however, is not limited to this configuration. In other words, three or more coil magnetic fields $H_C$ having different intensities may be generated to calculate a sensitivity a from respective output voltages V, using a least squares method.

In the present embodiment, since a magnetic field having a small measurement range, such as a geomagnetic field is a measurement target, an output voltage V and a magnetic field H can be regarded as being in a linear function relationship within a magnetic field fluctuation range, as described above. Thus, in this range, the sensitivity a can be regarded as constant, and thus, it is sufficient to store only one numerical value as the sensitivity a. However, if a fluctuation range of a target magnetic field to be measured is so large to determine that the sensitivity a is not constant in the fluctuation range, it is preferable to generate three or more coil magnetic fields $H_C$ having different intensities so as to acquire and store a numerical expression that enables to obtain sensitivities from a lower limit to an upper limit of a range in which the sensitivity may fluctuate.

As indicated in step S7 in FIG. 7, in the present embodiment, when the output voltage $V_x$ is measured, the energization of the magnetic field generation coils 22 is stopped. The present invention, however, is not limited to this configuration. In other words, the output voltage $V_x$ may be measured in a state where a coil magnetic field $H_C$ is generated by the energization of the magnetic field generation coils 22. In this case, the output voltage $V_X$ suffers additionally influence of the coil magnetic field $H_C$. Thus, a sum $(H_E + H_C)$ of the outside-device magnetic field $H_E$ and the coil magnetic field $H_C$ is calculated according to the following expression.

$$H_E + H_C = (V_X - V_{OFF})/a_2$$

Therefore, in order to calculate the outside-device magnetic field $H_E$, it is necessary to subtract the coil magnetic field $H_C$ from the calculated value $H_E + H_C$.

(Embodiment 2)

Figure 14:
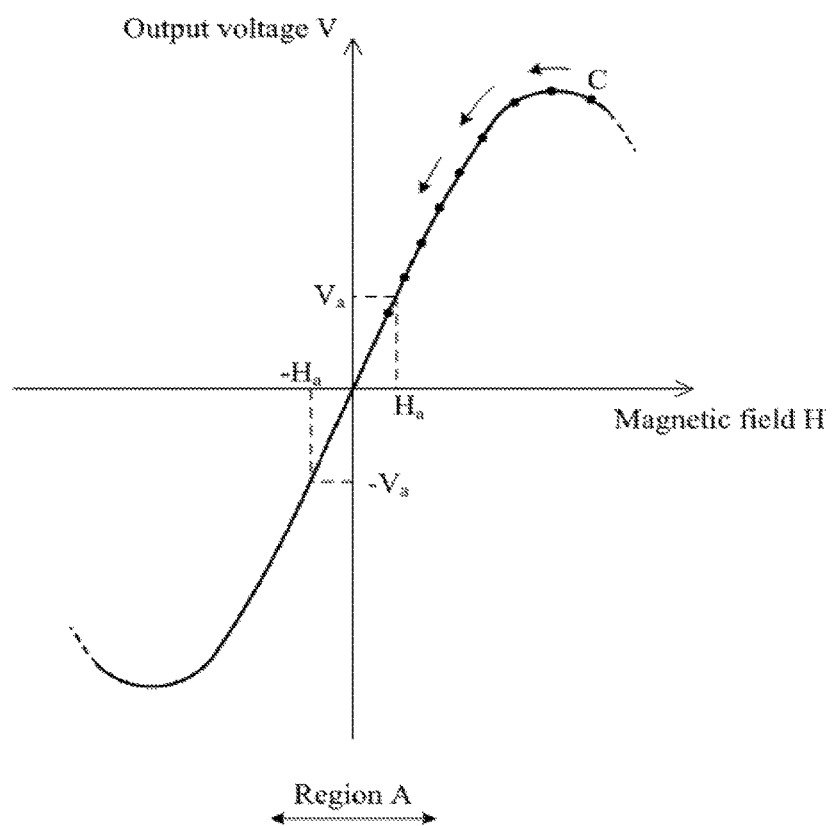
FIG. 14 is a graph indicating a relationship between a magnetic field acting on a magneto-sensitive body and an output voltage of a detection coil in Embodiment 2.

The present embodiment is an example in which an inside-device magnetic field $H_I$ is cancelled out by a coil magnetic field $H_C$ generated from magnetic field generation coils 22. As indicated in FIG. 14, an outside-device magnetic field $H_E$ can be measured in a region that falls outside region A, for example, at point C, however, the outside-device magnetic field $H_E$, in some cases, can be measured more accurately if a sensitivity a is within region A because the sensitivity a is more stable within region A than at point C.

Thus, in the present embodiment, an inside-device magnetic field $H_I$ is cancelled out by a coil magnetic field $H_C$ generated from the magnetic field generation coils 22, and thus a magnitude of a magnetic field acting on a magneto-sensitive body 20 is reduced to have a value within region A, and then an outside-device magnetic field $H_E$ is measured.

Figure 12:
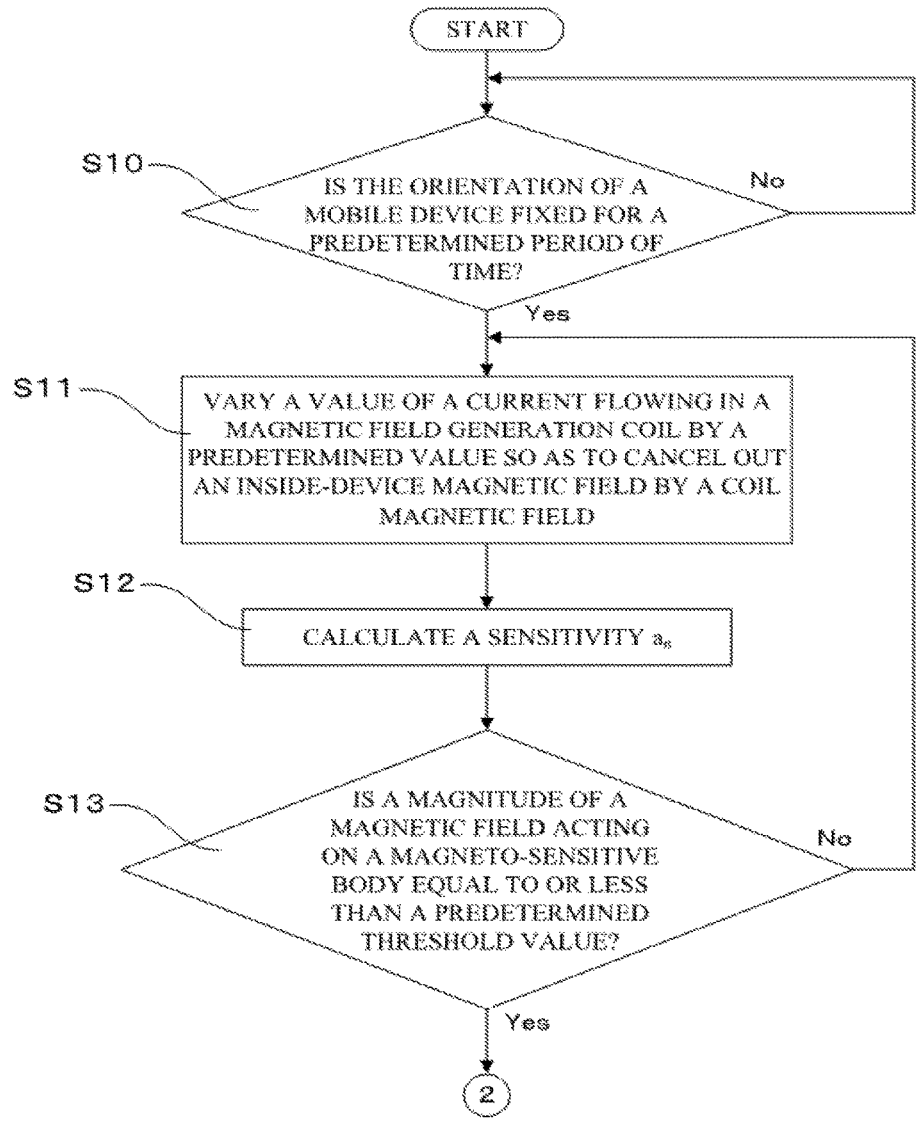
FIG. 12 is a flowchart for a magnetic field measurement device in Embodiment 2.
Figure 13:
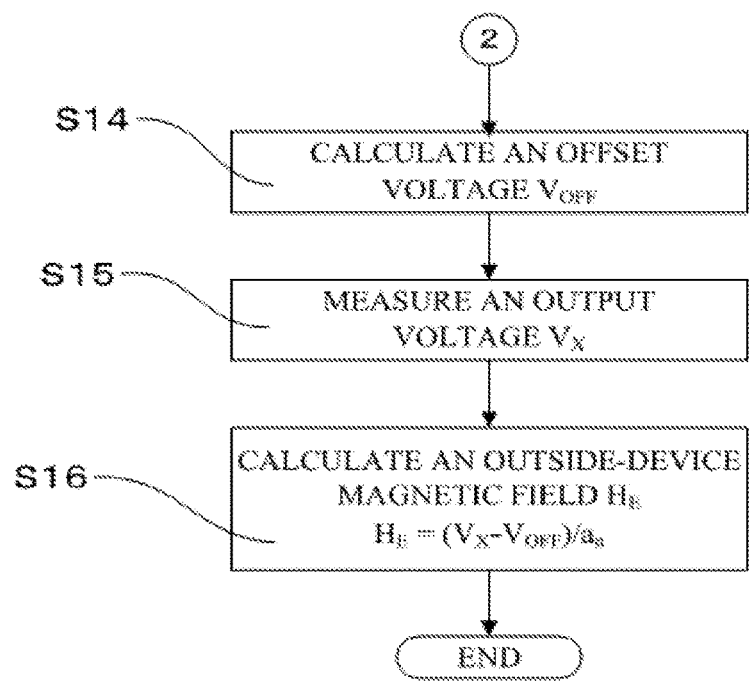
FIG. 13 is a flowchart following the flowchart in FIG. 12.

Processing in the magnetic field measurement device 1 according to the present embodiment will be described with reference to the flowchart in FIGS. 12 and 13. As illustrated in FIG. 12, in the present embodiment, first, in step S10, whether or not an orientation of a mobile device 10 is fixed for a predetermined period of time is determined. In other words, whether or not an outside-sensor magnetic field $H_O$ acting on the magneto-sensitive body 20 is constant for a predetermined period of time is determined. Here, if the determination results in "Yes", the processing proceeds to step S11. Here, a value of a current flowing in the magnetic field generation coils 22 is varied by a predetermined value so that the inside-device magnetic field $H_I$ is cancelled out by a coil magnetic field $H_C$.

Subsequently, the processing proceeds to step S12 to calculate a sensitivity $a_n$. Next, the processing proceeds to step S13 to determine whether or not a magnitude of a magnetic field acting on the magneto-sensitive body 20 is equal to or less than a predetermined threshold value Ha. If the determination results in "Yes" here, the processing proceeds to step S14. If the determination in this step results in "No", the processing returns to step S11.

In step S12, the sensitivity $a_n$ can be calculated on the basis of, for example, an output voltage $V_{n-1}$ measured at the previous time, an output voltage $V_n$ measured at the present time and a magnetic field variation $H_{n-1}-H_n$, according to, for example, the following expression.

$$a_n = (V_{n-1} - V_n)/(H_{n-1} - H_n)$$

In step S13, for example, whether or not there is constancy among a plurality of measured sensitivities $a_n$, $a_{n-1n}$, $a_{n-2n}$, and so on is determined. If there is constancy, a magnetic field H acting on the magneto-sensitive body 20 can be calculated according to the following expression.

$$H = V/a_n$$

In step S13, whether or not a magnitude of the magnetic field H thus calculated is smaller than a threshold value Ha is determined.

In step S14, a user performs the above-described calibration operation to calculate an offset voltage $V_{OFF}$. Then, the processing proceeds to step S15 to measure an output voltage $V_X$. Subsequently, the processing proceeds to step S16 to calculate a value of an outside-device magnetic field $H_E$ according to the following expression.

$$H_E = (V_X - V_{OFF})/a_n$$

Operational effects of the present embodiment will be described. A sensitivity a of the MI sensor 2 can be regarded as constant as long as a magnetic field acting on the magneto-sensitive body 20 is within region A in FIG. 2, however, if a magnetic field having an intensity falling beyond region A acts on the magneto-sensitive body 20, the sensitivity a fluctuates. In the present embodiment, since a value of an outside-device magnetic field $H_E$ is calculated in a state where a magnetic field acting on the magneto-sensitive body 20 is reduced to be smaller than the aforementioned threshold value Ha by supplying a current to the magnetic field generation coils 22, a magnetic field can be calculated in a state where the sensitivity a is more stable, and thus enabling more accurate calculation of the outside-device magnetic field $H_E$.

In other respects, the present embodiment has configurations and operational effects that are similar to those of Embodiment 1.

The invention claimed is:

1. A magnetic field measurement device for measuring a magnetic field, comprising:
    a magneto-impedance sensor including:
        a magneto-sensitive body,
        a detection coil that is wound around the magneto-sensitive body and outputs a voltage corresponding to a magnetic field acting on the magneto-sensitive body, and
        a magnetic field generation coil that is wound around the magneto-sensitive body and generates a magnetic field upon energization;
    a sensitivity calculation means for calculating a sensitivity, the sensitivity being a value that is obtained by varying a value of a current flowing in the magnetic field generation coil to vary the magnetic field acting on the magneto-sensitive body in a state where an outside-sensor magnetic field that acts on the magneto-sensitive body from outside the magneto-impedance sensor is constant, and dividing a variation in an output voltage of the detection coil by a variation in the magnetic field acting on the magneto-sensitive body; and
    a magnetic field calculation means,
    wherein the magneto-impedance sensor is mounted on a device,
    the outside-sensor magnetic field is a composition magnetic field of an outside-device magnetic field that acts on the magneto-sensitive body from outside the device and an inside-device magnetic field that is generated from an electronic component provided inside the device and acts on the magneto-sensitive body, and
    the magnetic field calculation means calculates a value of the outside-device magnetic field using the sensitivity calculated by the sensitivity calculation means and the output voltage of the detection coil.

2. The magnetic field measurement device according to claim 1, wherein the sensitivity calculation means varies the value of the current flowing in the magnetic field generation coil so that the inside-device magnetic field is cancelled out by a coil magnetic field generated from the magnetic field generation coil, and calculates the sensitivity in a process to vary the value of the current, and the magnetic field calculation means calculates the value of the outside-device magnetic field in a state where a magnitude of the magnetic field acting on the magneto-sensitive body is made to be smaller than a predetermined threshold value by feeding a current to the magnetic field generation coil.

3. The magnetic field measurement device according to claim 1, wherein the voltage is proportional to the magnetic field acting on the magneto-sensitive body.

4. The magnetic field measurement device according to claim 1, wherein the device is a mobile device.

5. A magnetic field measurement device for measuring a magnetic field, comprising:
    a magneto-impedance sensor including:
        a magneto-sensitive body,
        a detection coil that is wound around the magneto-sensitive body and outputs a voltage corresponding to a magnetic field acting on the magneto-sensitive body, and
        a magnetic field generation coil that is wound around the magneto-sensitive body and generates a magnetic field upon energization;

first circuitry configured to calculate a sensitivity, the sensitivity being a value that is obtained by varying a value of a current flowing in the magnetic field generation coil to vary the magnetic field acting on the magneto-sensitive body in a state where an outside-sensor magnetic field that acts on the magneto-sensitive body from outside the magneto-impedance sensor is constant, and dividing a variation in an output voltage of the detection coil by a variation in the magnetic field acting on the magneto-sensitive body; and second circuitry, wherein the magneto-impedance sensor is mounted on a device, the outside-sensor magnetic field is a composition magnetic field of an outside-device magnetic field that acts on the magneto-sensitive body from outside the device and an inside-device magnetic field that is generated from an electronic component provided inside the device and acts on the magneto-sensitive body, and the second circuitry calculates a value of the outside-device magnetic field using the sensitivity calculated by the first circuitry and the output voltage of the detection coil.

6. The magnetic field measurement device according to claim 5, wherein the first circuitry varies the value of the current flowing in the magnetic field generation coil so that the inside-device magnetic field is cancelled out by a coil magnetic field generated from the magnetic field generation coil, and calculates the sensitivity in a process to vary the value of the current, and the second circuitry calculates the value of the outside-device magnetic field in a state where a magnitude of the magnetic field acting on the magneto-sensitive body is made to be smaller than a predetermined threshold value by feeding a current to the magnetic field generation coil.

7. The magnetic field measurement device according to claim 5, wherein the voltage is proportional to the magnetic field acting on the magneto-sensitive body.

8. The magnetic field measurement device according to claim 5, wherein the device is a mobile device.

* * * * *